United States Patent
Yu et al.

[11] Patent Number: 6,147,913
[45] Date of Patent: Nov. 14, 2000

[54] DATA TRANSMISSION CIRCUITRY OF A SYNCHRONOUS SEMICONDUCTOR MEMORY DEVICE

[75] Inventors: Hak-Soo Yu; Su-Chul Kim, both of Seoul, Rep. of Korea

[73] Assignee: Samsung Electronics, CO., Ltd., Suwon, Rep. of Korea

[21] Appl. No.: 09/513,621

[22] Filed: Feb. 25, 2000

Related U.S. Application Data

[63] Continuation of application No. 09/370,842, Aug. 9, 1999.

[30] Foreign Application Priority Data

Aug. 7, 1998 [KR] Rep. of Korea .................. 98-32232

[51] Int. Cl.[7] ............................................ G11C 7/00
[52] U.S. Cl. ........................ 365/189.02; 365/189.12; 365/221
[58] Field of Search ................... 365/189.02, 189.12, 365/221, 233, 238.5

[56] References Cited

U.S. PATENT DOCUMENTS

5,513,327  4/1996  Farmwald et al. ............... 395/309
5,715,211  2/1998  Toda .................................. 365/233
5,818,776  10/1998  Shibutani et al. ................. 365/221
6,038,184  3/2000  Naritake .............................. 365/221

*Primary Examiner*—Son Mai
*Attorney, Agent, or Firm*—Marger Johnson & McCollom, P.C.

[57] ABSTRACT

A synchronous memory comprises a memory cell array having a plurality of memory cells; a clock control circuit for receiving a first clock signal, a second clock signal, and a third clock signal, and for generating an internal clock signal, a plurality of control signals, and a plurality of flag signals. The memory includes a first register circuit for storing a plurality of input data bits in response to the internal clock signal and to the control signals; a second register circuit for storing the flag signals in response to the internal clock signal and the control signals; a write drive circuit for writing the input data bits passing through the first register circuit into the memory cell array in response to the flag signals during a write cycle; a sense amplifier circuit coupled to the memory cell array, an address comparator circuit for receiving read and write address signals and for generating a first, a second, and a third combination signals; and a switching circuit for transferring the input data bits passing through the first register circuit and the flag signals passing through the second register circuit to output terminals of the device.

4 Claims, 7 Drawing Sheets

DATA TRANSMISSION CIRCUITRY OF A SYNCHRONOUS SEMICONDUCTOR MEMORY DEVICE

This is a continuation application from U.S. patent application Ser. No. 09/370,842, filed Aug. 9, 1999.

FIELD OF THE INVENTION

The present invention relates to a synchronous semiconductor memory, and more particularly to a data transmission of a synchronous memory device, which responds to an external clock signal.

BACKGROUND OF THE INVENTION

In a computer processing system, operation speeds of dynamic random access memories (DRAMs) used as main memories have been increased, but are still low compared with operation speeds of microprocessors. This discrepancy creates a wait time of the microprocessor and does not allow fast data processing, as the slower access time and cycle time of the DRAM form a bottleneck that affects the performance of the whole system.

In order to eliminate a difference in the operation speed between the DRAM and microprocessor, synchronous memory devices operable in synchronization with a clock signal have recently been developed, which has enabled SDRAMs to be used as main memories for fast microprocessors. In the SDRAM, introducing of external signals, i.e., address signals, control signals, and input/output data, is carried out in synchronization with a clock signal which is the system clock provided by the microprocessor. Since the external signals are introduced into the SDRAM device in synchronization with the whole system clock signal, it is not necessary to take into consideration a margin for skew of these external signals, and therefore an internal operation can be started rapidly. And since input and output data are transferred therein in synchronization with the clock signal, the accessing speed of data corresponds to the clock signal, allowing fast data transmission to be attained.

In order to enhance the accessing speeds to be more than those of single-data-rate SDRAMs, there have been proposed double-data-rate SDRAMs. These are accessible in response to each transition of the clock signal, i.e., responding to not only rising edges of the clock signal, but also to its falling edges.

One of the attractive functions of the SDRAM is that continuous bits per data input/output terminal make an access speed of data be more enhanced, i.e., a pipelined SDRAM. A burst length of the pipelined SDRAM is defined as the number of data bits continuously transferred to one input/output terminal in a sensing cycle (or a RAS cycle). The burst length is an important parameter or factor for determining a capacity of data read-out in one sensing cycle in the synchronous memory device. For both the single- and double-data-rate SDRAMs, performance of a data transmission in the SDRAM is mostly dependent upon controlling and optimizing the burst length or relevant accessing features such as a bypass architecture, in correspondence with the clock signal. In general, the burst length is flexible to different designer options, and its choice is related to the choice of the operation frequency of the clock signal.

Figure 1:
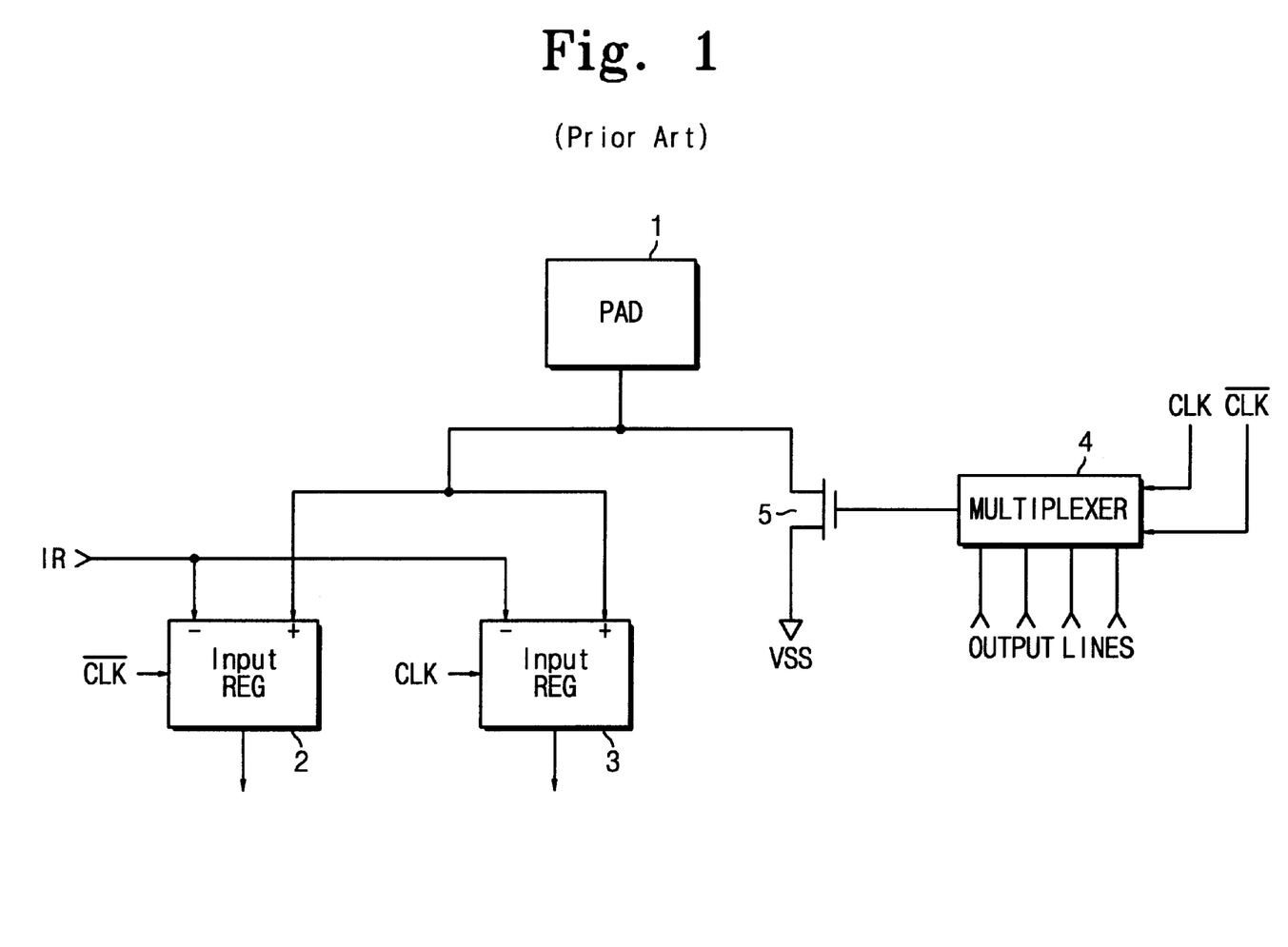
FIG. 1 is a block diagram of a known data transmission circuit of a synchronous memory device.

FIG. 1 shows an exemplary electrical circuit for performing a data transmission in a synchronous memory device. The circuit includes a pad 1, input registers 2 and 3, multiplexer 4, and an output driving transistor 5. Pad 1 transfers external input data to the registers and output data driven by transistor 5 to an external circuit (not shown, out of the device). The registers 2 and 3 receive input reference signals, and store the input data to be applied to internal circuits in response to a pair of complementary clock signal CLK and CLKB (suffix "B" of a signal name means the counter-logic of the signal, and is marked with over-bar in the corresponding drawing). Multiplexer 4 applies data generated from the internal circuits to gate of transistor 5 in response to the pair of clock signals CLK and CLKB.

A synchronous burst pipelined memory having the late-write and double-data-rate (DDR) features writes data into memory cells at least one clock cycle after the addresses and control inputs have been presented. The memory can access data in response to both rising and falling edges of a clock signal CLK (or CLKB).

Figure 2:
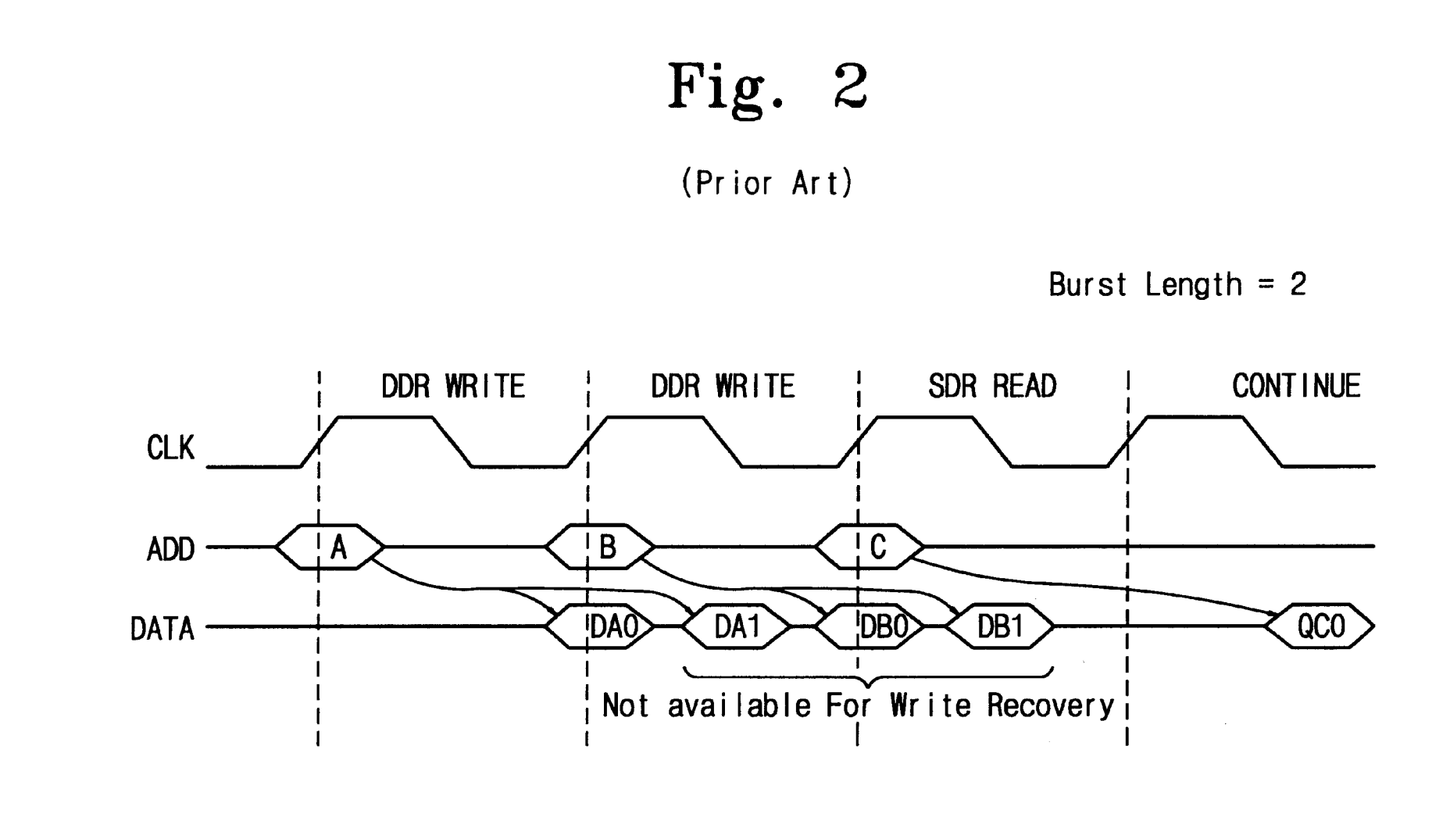
FIG. 2 is a timing diagram for explaining a problem encountered in a coventional pipelined burst memory with the double-data-rate and late-write features in the case where a write operation is followed by a read operation without an interposing dummy cycle.

FIG. 2 is a timing diagram for explaining a problem encountered in a conventional pipelined burst memory, with the double-data-rate and late-write features in the case where a write operation is followed by a read operation without any vacant or no-operation (NOP) cycle therebetween. For simplicity, the problem will be discussed assuming the memory device operates in the burst length of 2.

Referring to FIG. 2, external addresses ADD are taken into the device in synchronization with a rising edge of clock signal CLK (i.e., a system clock). Specifically, external addresses A and B for two double-data-rate (DDR) write operations are introduced into the device at rising edges of the first and second cycles, respectively, of clock signal CLK. Then, input data DA0 and DA1, and DB0 and DB1 are applied to input buffer circuits (not shown) of the device from the second cycle of clock signal CLK, owing to the late-write feature. Data DA0 and DA1 correspond to address A, and DB0 and DB1 to B. Each set of the input data (DA0 and DA1, or DB0 and DB1) is accessed at both rising and falling edges of clock signal CLK, i.e., the double-data-rate mode.

A limitation of the prior art device is that a read cycle cannot start right after a write cycle. Indeed, a vacant (also known as "dummy") cycle must elapse for a write recovery. More specifically, if a read address C for a single-data-rate (SDR) read operation in a ready cycle were to be started just after the write cycle of address B without an interposing dummy cycle as shown in FIG. 2, it is impossible to write the input data bits DA1, DB0, and DB1 because of the write recovery. Only DA0 will be written. Therefore, even though the input data bits DA1, DB0, and DB1 are successfully taken into the device, they can not be written into memory cells selected by the addresses A and B during a write recovery period.

In the above case, in the event that the read address C is identical with the write address A or B, it is desirable to bypass the data DA1, DB0, or DB1 as output data corresponding to the read address C. It is very difficult, however, to realize a bypass control logic for such a conventional burst double-data-rate memory with flexible burst modes, in which the burst length can be changed.

SUMMARY OF THE INVENTION

Accordingly, it is an object of the invention to provide a synchronous memory device having flexible data accessing operations adaptable to various read and write timings.

It is another object of the invention to provide a synchronous memory device having a flexible burst length and having various data accessing configurations in accordance to variation of read and write operating modes.

It is yet another object of the present invention to provide a synchronous burst double-data-rate memory device having an input/output data transmission circuit capable of bypassing write data correctly despite changes of burst length.

In order to accomplish those objects, a synchronous memory generates a bypass transmission for data that would be lost without a dummy cycle. The memory of the invention comprises a memory cell array, a clock control circuit for receiving a first clock signal, a second clock signal, and a third clock signal, and for generating an internal clock signal, a plurality of control signals, and a plurality of flag signals, a first register circuit for storing a plurality of input data bits in response to the internal clock signal and the control signals, a second register circuit for storing the flag signals in response to the internal clock signal and the control signals, a write drive circuit for writing the input data bits passing through the first register circuit into the memory cell array in response to the flag signals during a write cycle, a sense amplifier circuit coupled to the memory cell array, an address comparator circuit for receiving read and write address signals and for generating a first, a second, and a third combination signals, and a switching circuit for transferring the input data bits passing through the first register circuit and the flag signals passing through the second register circuit to output terminals of the device.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Hereinbelow, applicable embodiments of the invention are described, to be understood in conjunction with the appended drawings. It will be appreciated that the invention generates a bypass transmission for accommodating data bits that would otherwise require interposing a dummy cycle.

Figure 3:
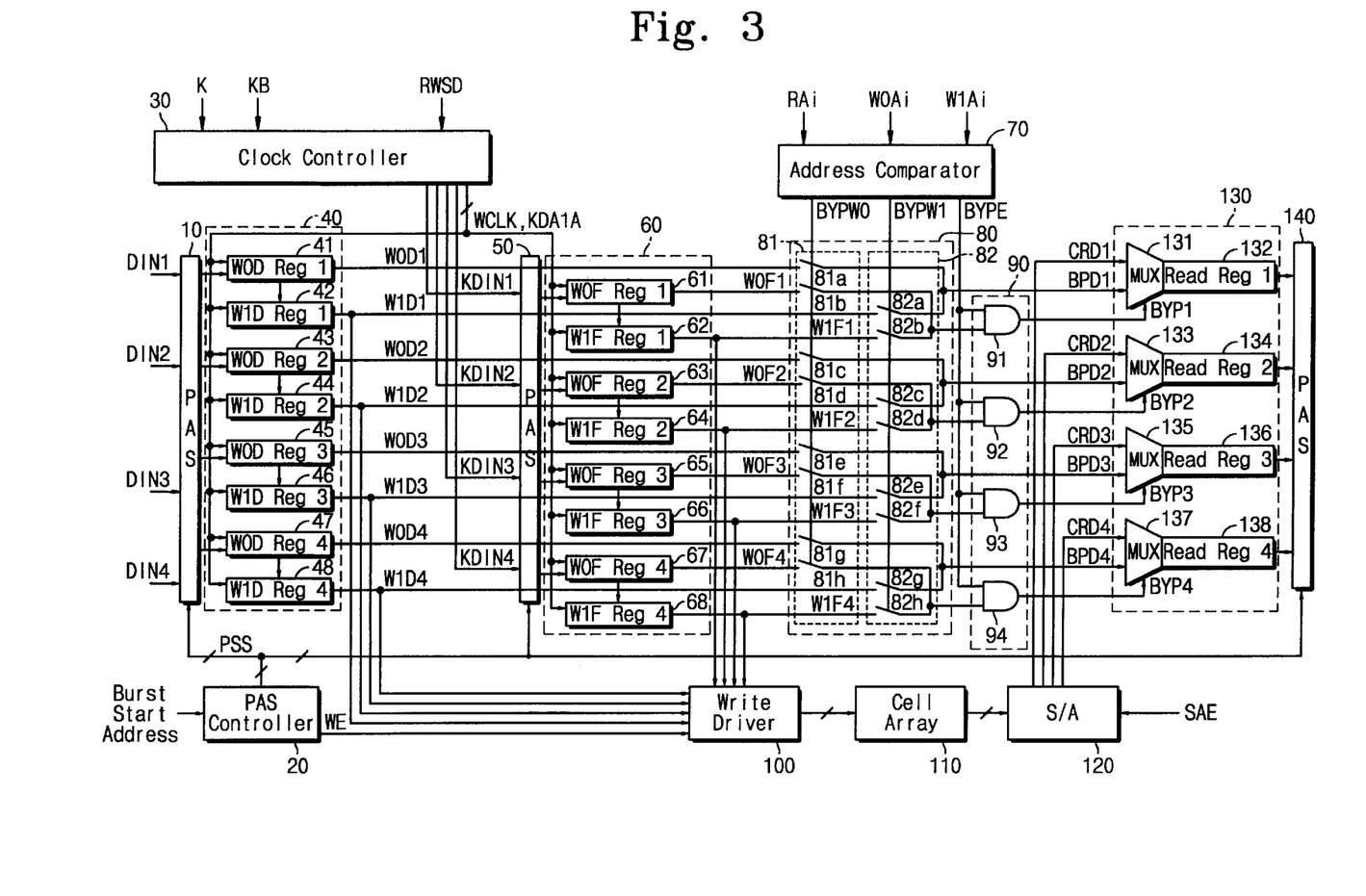
FIG. 3 is a schematic diagram showing an arrangement of data transmission circuitry in a synchronous pipelined burst memory device with double-data-rate mode according to the present invention.

FIG. 3 is a schematic diagram showing an arrangement of data transmission circuitry in a synchronous pipelined burst memory device supporting double-data-rate mode according to the present invention. This embodiment is explained in the case of a maximum burst length of 4. This is done only for simplicity, and it should be noted that the present invention is applicable to the memory devices supporting a burst length of more than 4.

Referring to FIG. 3, a synchronous memory device of the invention includes path selection circuits (or path adjusting switch circuits) 10, 50, and 140, a path selection control circuit 20, a clock control circuit 30, a first register circuit 40, a second register circuit 60, an address comparator 70, a switching circuit 80, an output control circuit 90, a write drive circuit 100, a memory cell array 110, a sense amplifier circuit 120, and a data output circuit 130.

Path selection circuits 10, 50, and 140 determine conducting paths of external input data in response to path selection signals PSS generated from path selection control circuit 20. For example, path selection circuit 10 receives input data DIN1–DIN4, which have been passed through input buffer circuits in a predetermined burst sequence (e.g., interleaved sequence or sequential sequence), and transmits the input data DIN1–DIN4 to appropriate registers within the first register circuit 40. Path selection control circuit 20 receives a burst starting address BSA, data rate mode information (i.e., single-data-rate or double-data-rate) and burst information (i.e., burst length and burst sequence), and generates path selection signals PSS and a write enable signal WE.

Clock control circuit 30 receives external clock signals K and KB, and mode control signals RWSD (e.g., B1, B2 and B3) for controlling read/write operations, single-data-rate/double-data-rate and burst length. The clock control circuit 30 generates internal clock signals WCLK and KDA1A, which are pulse signals being activated in synchronism with falling (or rising) edges and rising (or falling) edges of the external clock signal K (or KB) respectively during write operations. The clock control circuit 30 also generates flag signals KDIN1–KDIN4, which are selectively activated depending upon burst length. The clock signals WCLK and KDA1A, and flag signals KDIN1–KDIN4 are used for controlling data paths of the input data DIN1–DIN4 in accordance with the single-/double-data-rate and the read/write operation.

Register circuits 40 and 60 store, selectively, the input data DIN1–DIN4 and flag signals KDIN1–KDIN4, respectively, in synchronization with clock signals WCLK and KDA1A.

The register circuit 40 includes eight registers 41–48. Registers 41, 43, 45 and 48 are 1-stage pipelined registers, and are coupled to the path selection circuit 10. Registers 42, 44, 46 and 48 are 2-stage pipelined registers, and are coupled to the 1-pipelined registers 41, 43, 45 and 47, respectively. The clock signals WCLK and KDA1A are supplied to the respective registers 41–48. The input data DIN1–DIN4 are 1-stage or 2-stage pipelined in synchronism with the clock signals WCLK and KDA1A. The registers 41, 43, 45 and 47 provide 1-stage pipelined data signals W0D1, W0D2, W0D3 and W0D4, respectively. The registers 42, 44, 46 and 48 provide 2-stage pipelined data signals W1D1, W1D2, W1D3 and W1D4, respectively. The flag signals KDIN1–KDIN4 from the clock control circuit 30 are supplied to the path selection circuit 50, and are set to a predetermined logic state (e.g., logic 1) when corresponding input data signals DIN1–DIN4 are valid.

The register circuit 60 also includes eight registers 61–68. Registers 61, 63, 65 and 68 are 1-stage pipelined registers, and are coupled to the path selection circuit 50. Registers 62, 64, 66 and 68 are 2-stage pipelined registers, and are coupled to the 1-pipelined registers 61, 63, 65 and 67, respectively.

The clock signals WCLK and KDA1A are also supplied to the respective registers 61–68. The flag signals KDIN1–KDIN4 are 1-stage or 2-stage pipelined in synchronism with the clock signals WCLK and KDA1A. The registers 61, 63, 65 and 67 provide 1-stage pipelined flag signals W0F1, W0F2, W0F3 and W0F4, respectively. The registers 62, 64, 66 and 68 provide 2-stage pipelined flag signals W1F1, W1F2, W1F3 and W1F4, respectively.

Address comparator 70 generates bypass control signals BYPW0, BYPW1, and BYPE made from comparing a read address RAi with a write address W0Ai (i.e., 1-stage pipelined address) or W1Ai (i.e., 2-stage pipelined address). When the read address RAi is identical with the 1-stage pipelined write address W0Ai, the bypass control signals BYPW0 and BYPE are activated. When the read address RAi is identical with the 2-stage pipelined write address W1Ai, the bypass control signals BYPW1 and BYPE are activated. These are also known as combination signals, and are used to detect when a bypass transmission is to take place.

Switching circuit 80 makes conduction paths of the pipelined input data and flag signals W0F1, W1F1, W0F2, W1F2, W0F3, W1F3, W0F4, and W1F4 be selectively opened in response to the bypass control signals BYPW0 and BYPW1. Switching circuit 80 is formed of two switching units 81 and 82.

In switching unit 81 including plural switches 81*a*–81*h*, switches 81*a*, 81*c*, 81*e*, and 81*g* are connected between registers 41, 43, 45, and 47 of register circuit 40 and data output circuit 130, and open and close conduction paths for 1-stage pipelined data W0D1–W0D4. Switches 81*b*, 81*d*, 81*f*, and 81*h* are connected between registers 61, 63, 65, and 67 of register circuit 60 and output control circuit 90, and open and close conduction paths for 1-stage pipelined flag signals W0F1–W0F4 supplied from register circuit 60, in response to signal PYPW0.

In switching unit 82 including plural switches 82*a*–82*h*, swithces 82*a*, 82*c*, 82*e*, and 82*g* are connected between registers 42, 44, 46, and 48 of register circuit 40 and data output circuit 130, and open and close conduction paths for 2-stage pipelined data W1D1–W1D4 supplied from register circuit 40. Switches 82*b*, 82*d*, 82*f*, and 82*h* are connected between register 62, 64, 66, and 68 of register circuit 60 and output control circuit 90, and open and close conduction paths for 2-stage pipelined flag signals W1F1–W1F4 supplied from register circuit 60, in response to signal BYPW1.

Output control circuit 90 receives four selected pipelined flag signals W0F1–W0F4 or W1F1–W1F4 from switching circuit 80 and the bypass control signal BYPE from the address comparator 70, and generates output control signals BYP1–BYP4. Output control circuit 90 is formed of AND gates 91–94.

AND gate 91 is connected between switches 81*b* and 82*b*, signal line of BYPE, and data output circuit 130. AND gate 91 generates output control signal BYP1 from combining flag signal W0F1 or W1F1 supplied selectively through switches 81*b* and 82*b*, with signal BYPE.

AND gate 92 is connected between switches 82*d* and 81*d*, signal line of BYPE, and data output circuit 130. AND gate 92 generates output control signal BYP2 from combining flag signal W0F2 or W1F2 supplied selectively through switches 82*d* and 81*d*, with signal BYPE.

AND gate 93 is connected between switches 81*f* and 82*f*, signal line of BYPE, and data output circuit 130. AND gate 93 generates output control signal BYP3 from combining flag signal W0F3 or W1F3 supplied selectively through switches 81*f* and 82*f*, with signal BYPE.

AND gate 94 is connected between switches 81*h* and 82*h*, signal line of BYPE, and data output circuit 130. AND gate 94 generates output control signal BYP4 from combining flag signal W0F4 or W1F4 supplied selectively through switches 81*h* and 82*h*, with signal BYPE.

Write drive circuit 100 is connected between register circuits 40 and 60, path selection control circuit 20, and memory cell array 110, and includes four write drivers (not shown individually) corresponding to the number of input data DIN1–DIN4. The write drivers write the 2-stage pipelined input data W1D1–W1D4 supplied from register circuit 40 into corresponding memory cells of memory cell array 110, respectively, in response to the 2-stage pipelined flag signals W1F1–W1F4 supplied from register circuit 60. The data W1D1–W1D4 can be written into their corresponding memory cells by the write drive circuit 100 only when the corresponding flag signals W1F1–W1F4 are active. For example, when the flag signals W1F1 and W1F2 are active, the write drive circuit 100 writes the data W1D1 and W1D2 supplied from the registers 41 and 42 into corresponding memory cells, respectively, but does not write the other data W1D3 and W1D4.

Memory cell array 110 includes a plurality of memory cells (not shown individually) coupled to wordlines and bitlines which are arranged in a matrix form, and store the 2-stage pipelined input data W1D1–W1D4 supplied through write drive circuit 100. Sense amplifier circuit 120 is connected between memory cell array 110 and data output circuit 130, including four sense amplifier (not shown individually). The sense amplifier detect data levels of data from corresponding memory cells of memory cell array 110, in response to a sensing enable signal SAE.

Data output circuit 130 includes multiplexers 131, 133, 135, and 137, and read registers 132, 134, 136, and 138. Multiplexers 131–137 are connected between switching circuit 80, output control circuit 90, and sense amplifier circuit 120, and alternatively transfer bypass data BPD1–BPD4 from switching circuit 80 and read-out data CRD1–CRD4 from amplifier circuit 120 to respectively corresponding registers 132, 134, 136, and 138. Read registers 132, 134, 136 and 138 are connected between multiplexers 131, 133, 135 and 137 and path selection circuit 140, and store selectively corresponding data out of bypass data BPD1–BPD4 and read-out data CRD1–CRD4. Path selection circuit 140 is connected between thr read registers of data output circuit 130 and data buses (not shown), and transfers a selected one out of the bypass and read-out data to the data buses.

Register circuit 40 includes plural registers 41–48 which are connected in parallel each other between path selection circuit 10 and switching circuit 80, and store eight input data DIN1–DIN4 supplied through path selection circuit 10, in response to write control clock signals WCLK and KDA1A.

Figure 4:
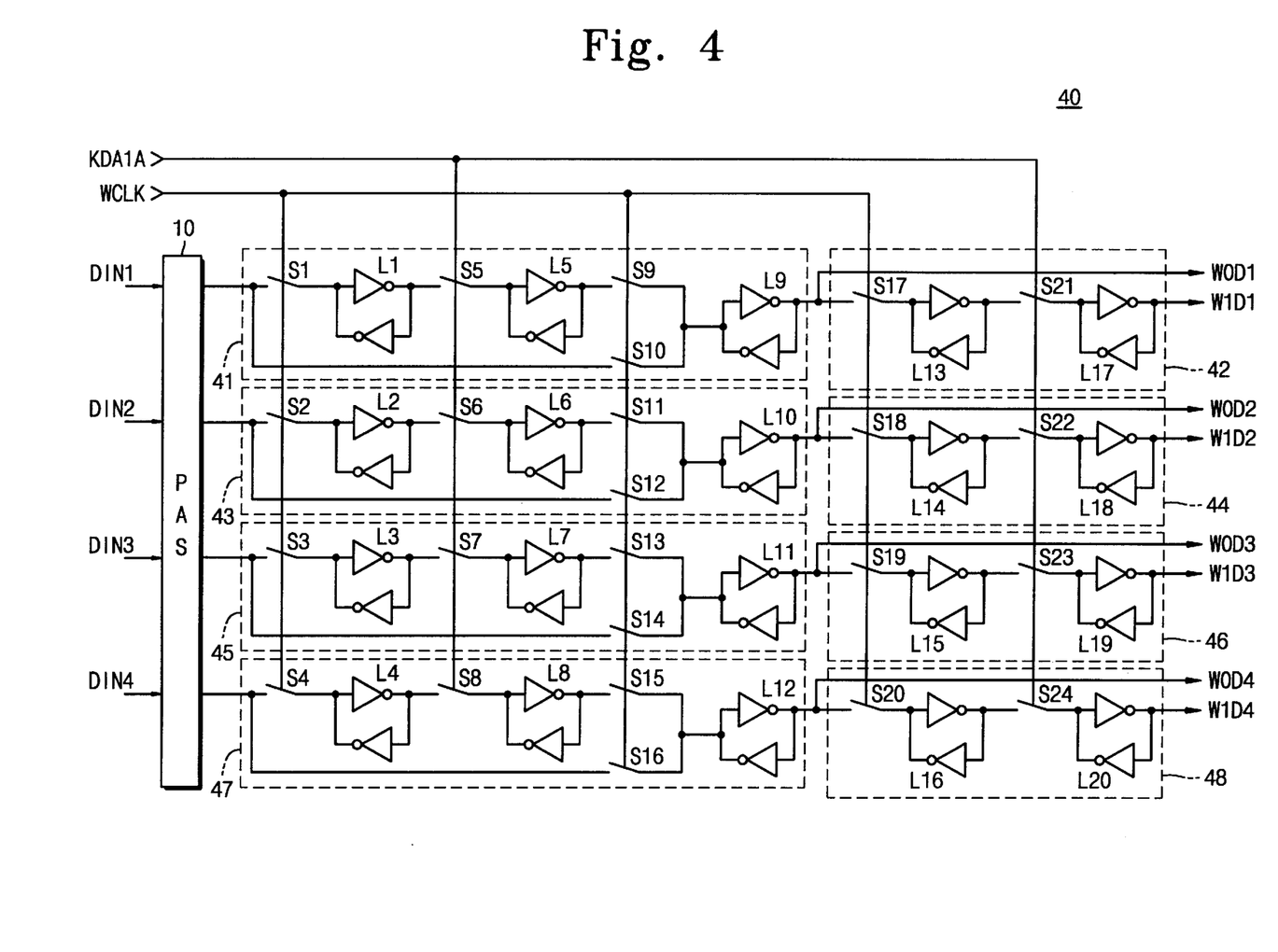
FIG. 4 is a circuit diagram of an input data storage circuit of FIG. 3.

Referring to FIG. 4, each of 1-stage pipelined data registers 41, 43, 45, and 47 includes four switches and three latches, which form two signal paths between the path selection circuit 10 and its corresponding 2-stage pipelined register 42, 44, 46 or 48.

More specifically, register 41 includes switches S1, S5, S9 and S 10, and latches L1, L5 and L9. Switches S1, S5 and S9 and latches L1 and L5 are serially connected between a first output of the path selection circuit 10 and the latch L9, and form a first signal path of the register 41. The switch S10 is connected in parallel with the first signal path between the first output of the path selection circuit 10 and the latch L9, and form a second signal path of the register 41.

Register 43 includes switches S2, S6, S11 and S12, and latches L2, L6 and L10. Switches S2, S6 and S11 and latches L2 and L6 are serially connected between a second output of the path selection circuit 10 and the latch L10, and form a first signal path of the register 43. The switch S12 is connected in parallel with the first signal path of the register 43 between the second output of the path selection circuit 10 and the latch L10, and form a second signal path of the register 43.

Register 45 includes switches S3, S7, S13 and S14, and latches L3, L7 and L11. Switches S3, S7 and S13 and latches L3 and L7 are serially connected between a third output of the path selection circuit 10 and the latch L11, and form a first signal path of the register 45. The switch S14 is connected in parallel with the first signal path of the register 45 between the third output of the path selection circuit 10 and the latch L11, and form a second signal path of the register 45.

Register 47 includes switches S4, S8, S15 and S16, and latches L4, L8 and L12. Switches S4, S8 and S15 and latches L4 and L8 are serially connected between a fourth output of the path selection circuit 10 and the latch L12, and form a first signal path of the register 47. The switch S16 is connected in parallel with the first signal path of the register 47 between the fourth output of the path selection circuit 10 and the latch L12, and form a second signal path of the register 47.

In each of the 1-stage pipelined registers, 41, 43, 45 and 47, one of the first and second signal paths is exclusively used in accordance with a write protocol adopted for the memory device of the present invention by employing a metal option, a bonding option or an electrically controlled option. Switches S1–S4, S9–S16 are controlled by the clock signal WCLK being activated in synchronism with the falling edges of the external clock signal K, and switches S5–S9 are controlled by the clock signal KDA1A being activated in synchronism with the rising edges of the external clock signal K. Outputs of latches L9–L12 become respectively 1-stage pipelined data signals W0D1–W0D4 which are applied to switching circuit 80.

Each of the 2-stage pipelined data registers 42, 44, 46 and 48 includes two switches and two latches. Register 42 includes switches S17 and S21 and latches L13 and L17. Register 44 includes switches S18 and S22 and latches L14 and L18. Register 46 includes switches S19 and S23 and latches L15 and L19. Register 48 includes switches S20 and S24 and latches L16 and L20. Switches S17–S20 are controlled by the clock signal WCLK, and switches S21–S24 are controlled by the clock signal KDA1A. Latches L17–L20 output the 2-stage pipelined data signals W1D1–W1D2, respectively, which are applied to switching circuit 80.

Returning briefly to FIG. 3, register circuit 60 includes plural registers 61–68. The registers are connected in parallel each other between path selection circuit 50 and switching circuit 80, and store flag signals KDIN1–KDIN4 supplied through path selection circuit 50, in response to write control clock signals WCLK and KDA1A.

Figure 5:
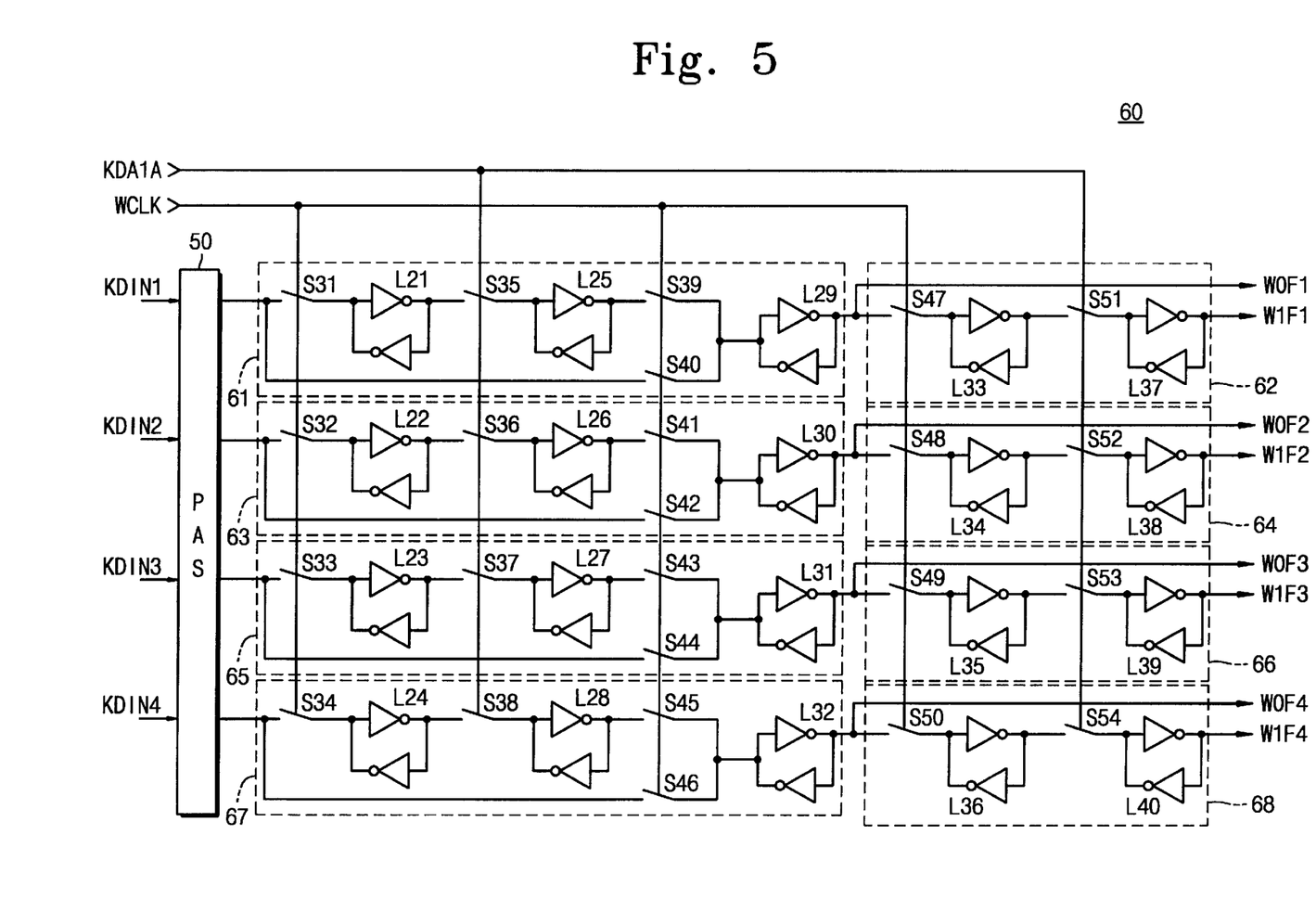
FIG. 5 is a circuit diagram of a flag storage circuit of FIG. 3.

Referring to FIG. 5, each of 1-stage pipelined flag registers 61, 63, 65, and 67 includes four switches and three latches which form two signal paths between the path selection circuit 50 and its corresponding 2-stage pipelined register 62, 64, 66 or 88.

Register 61 includes switches S31, S35, S39 and S40, and latches L21, L25 and L29. Switches S31, S35 and S39 and latches L21 and L25 are serially connected between a first output of the path selection circuit 50 and the latch L29, and form a first signal path of the register 61. The switch S40 is connected in parallel with the first signal path of the register 61 between the first output of the path selection circuit 50 and the latch L29, and form a second signal path of the register 61.

Register 63 includes switches S32, S36, S41 and S42, and latches L22, L26 and L30. Switches S32, S36 and S41 and latches L22 and L26 are serially connected between a second output of the path selection circuit 30 and the latch L30, and form a first signal path of the register 63. The switch S42 is connected in parallel with the first signal path of the register 63 between the second output of the path selection circuit 50 and the latch L30, and form a second signal path of the register 63.

Register 65 includes switches S33, S37, S43 and S44, and latches L23, L27 and L31. Switches S33, S37 and S43 and latches L23 and L27 are serially connected between a third output of the path selection circuit 50 and the latch L31, and form a first signal path of the register 65. The switch S44 is connected in parallel with the first signal path of the register 65 between the third output of the path selection circuit 50 and the latch L31, and form a second signal path of the register 65.

Register 67 includes switches S34, S38, S45 and S46, and latches L24, L28 and L32. Switches S34, S38 and S45 and latches L24 and L28 are serially connected between a fourth output of the path selection circuit 50 and the latch L32, and form a first signal path of the register 67. The switch S46 is connected in parallel with the first signal path of the register 67 between the fourth output of the path selection circuit 50 and the latch L32, and form a second signal path of the register 67.

In each of the 1-stage pipelined flag registers, 61, 63, 65 and 67, one of the first and second signal paths is also exclusively used in accordance with the write protocol adopted for the memory device of the present invention by employing such a metal, bonding or electrically controlled option. Switches S31–S34, S39–S46 are controlled by the clock signal WCLK being activated in synchronism with the falling edges of the external clock signal K, and switches S35–S39 are controlled by the clock signal KDA1A being activated in synchronism with the rising edges of the external clock signal K. Outputs of latches L29–L32 become the 1-stage pipelined flag signals W0F1–W0F4 which are applied to switching circuit 80.

Each of the 2-stage pipelined flag registers 62, 64, 66 and 68 includes two switches and two latches. Register 62 includes switches S47 and S51 and latches L33 and L37. Register 64 includes switches S48 and S52 and latches L34 and L38. Register 66 includes switches S49 and S53 and latches L35 and L39. Register 68 includes switches S50 and S54 and latches L36 and L40. Switches S47–S50 are controlled by the clock signal WCLK, and switches S51–S54 are controlled by the clock signal KDA1A. Latches L37–L40 output the 2-stage pipelined flag signals W1F1–W1F4, respectively, which are applied to switching circuit 80.

Returning briefly to FIG. 3, address comparator 70 receives a read address RAi, a 1-stage pipelined write address W0Ai and a 2-stage pipelined write address W1Ai, at input terminals thereof and compares the read address with both pipelined write addresses W0Ai and W1Ai. The address comparator 70 makes the signals BYPW0 and BYPE active (i.e., logic 1) when the read address RAi is identical with the 1-stage pipelined write address W0Ai, or makes the signals BYPW1 and BYPE active (i.e., logic 1)

when the read address RAi is identical with the 2-stage pipelined write address W1Ai.

When the signals BYPW0 and BYPE are active, the 1-stage pipelined data flag signals W0D1–W0D4 are respectively transferred to the multiplexers 131, 133, 135 and 137 as the bypass data BPD1–BPD4, and the 1-stage pipelined flag signals W0F1–W0F4 are respectively transferred to the multiplexers 131, 133, 135 and 137 through the AND gates 91–94 as the signals BYP1–BYP4. When the signals BYPW1 and BYPE are active, the 2-stage pipelined data signals W1D1–W1D4 are respectively trasferred to the multiplexers 131, 133, 135 and 137 as the bypass data BPD1–BPD4, and the 2-stage pipelined flag signals W1F1–W1F4 are respectively transferred to the multiplexers 131, 133, 135 and 137 through the AND gates 91–94 as the signals BYP1–BYP4. The multiplexers 131, 133, 135 and 137 each select the bypass data BPD1–BPD4 as read data when the signals BYP1–BYP2 are active (i.e., logic 1), but the multiplexers 131, 133, 135 and 137 each select the cell-read-out data CRD1–CRD4 provided from the sense amplifier circuit 120 as read data, instead of the bypass data BPD1–BPD4 when the signals BYP1–BYP2 are inactive (i.e. logic 0).

Figure 6:
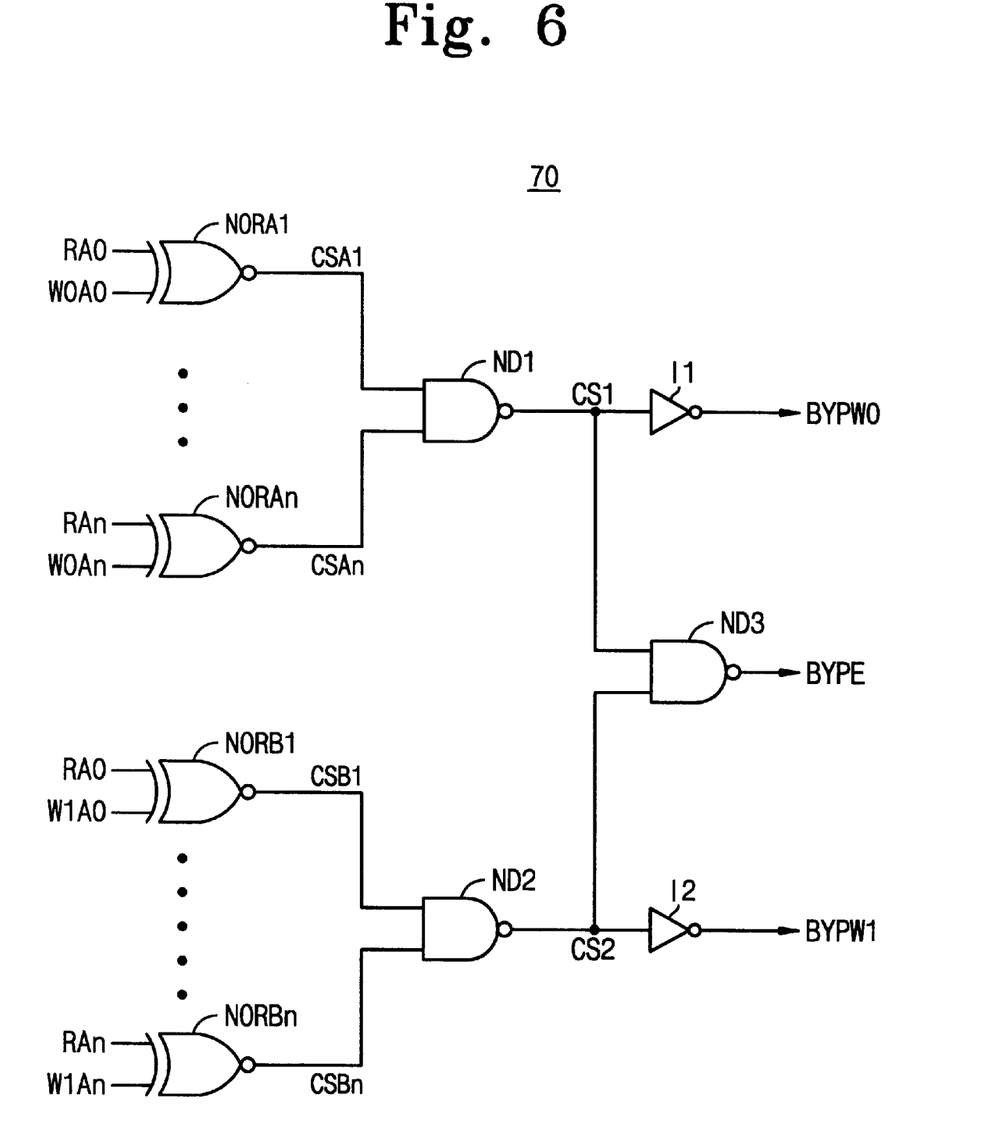
FIG. 6 is a circuit diagram of an address comparator circuit of FIG. 3.

Referring now to FIG. 6, address comparator 70 is formed of two groups of exclusive NOR gates NORA1–NORAn and NORB1–NORBn, NAND gates ND1–ND3, and inverters I1 and I2. The exclusive NOR gates NORA1–NORAn of one group are connected between input terminals of external addresses RAi and WOAi and inputer terminals of NAND gate ND1, and generate one group of combination signals CSA1–CSAn. The exclusive NOR gates NORB1–NORBn of the other group are connected between input terminals of external addresses RAi and WIAi and input terminals of NAND gate ND2, and generate one group of combination signals CSB1–CSBn. NAND gate ND1 receives combination signals CSA1–CSAn supplied from the exclusive NOR gates NORA1–NORAn of the first group, and generates combination signal CS1. NAND gate ND2 receives combination signal CSB1–CSBn supplied from the exclusive NOR gates NORB1–NORBn of the second group, and generates combination signal CS2. NAND gate ND3 receives the secondary combination signals CS1 and CS2, and generates control signal BYPE, while CS1 and CS2 become BYPW0 and BYPW1 each through inverters I1 and I2, respectively.

Figure 7:
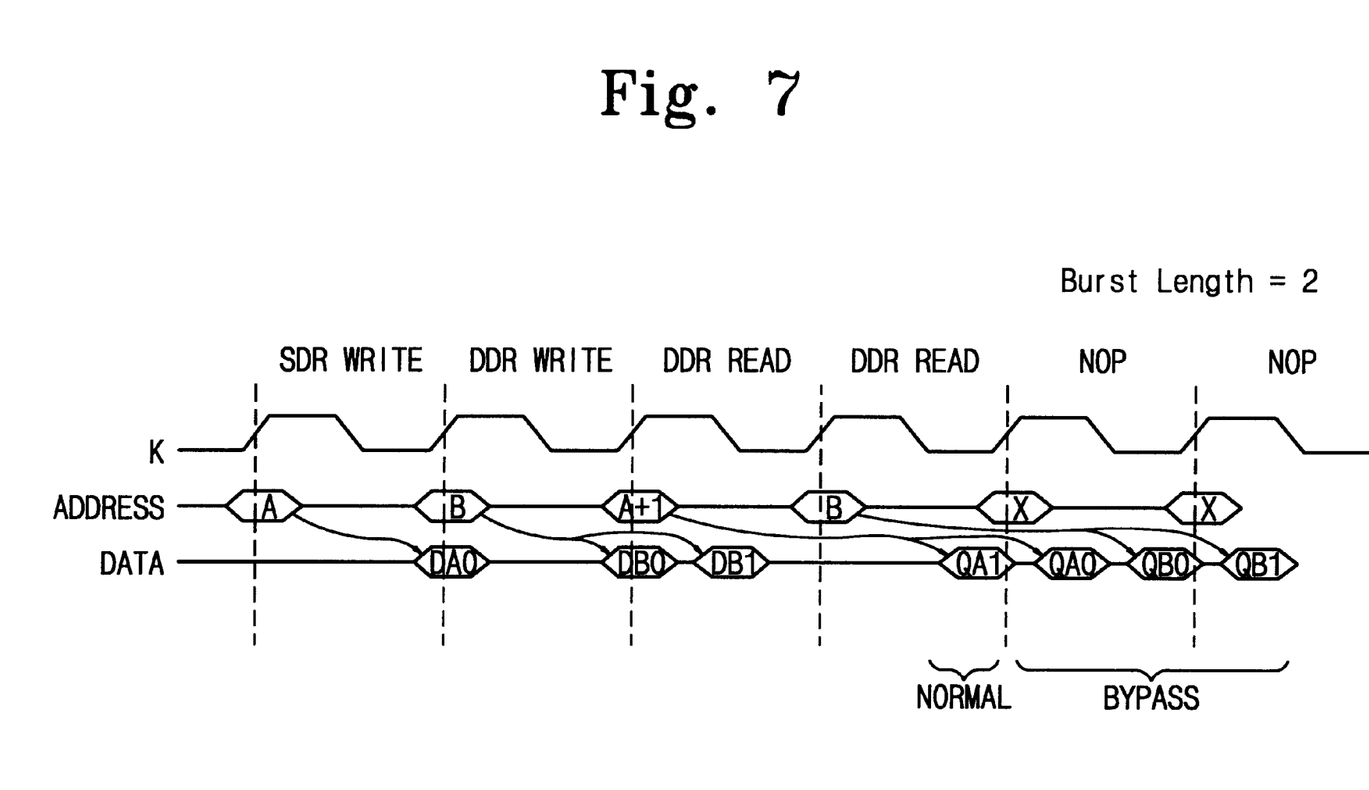
FIG. 7 is a timing diagram showing a data transmission operation with the circuits of FIG. 3.

Now, hereinafter, an explanation follows about a sequence of data transmission in the present synchronous device. Ahead of a practical explanation, it would be understood that a synchronous memory device performing its read/write operations in synchronization with an external clock signal is classified into two types in data accessing manner, i.e., signal-data-rate (SDR) and double-data-rate (DDR) as aforementioned, the SDR accessing a data bit for one cycle period of the clock signal while the DDR accessing two data bits for one cyle period of the clock signal. The number of output data bits corresponding to one address is dependent upon a value of burst length by which a manner of read/write operations is determined. And latency, which determines a starting time of writing or reading after an input of address, is divided into two types; one is that the writing is conducted in one cycle time of the clock signal (standard write protocol; SWP), and the other is in two cycles or more (late write protocol; LWP). FIG. 7 shows a late write protocol and a register read protocol, and may be operable in a single read/write mode or a double read/write mode (burst length is 2).

In the SDR mode, if addresses are A and B, then data DA0 and DB0 correspond to the addresses A and B. In the DDR mode, if addresses are A, A+1, B and B+1 then the data DA0 and DA1, DA1 and DA0, and DB0 and DB1, and DB1 and DB0 correspond to the addresses A, A+1, B and B+1. One address corresponds to one data in the SDR mode, but one address corresponds to two data in the DDR mode. For example, in the DDR mode, two storage locations, e.g., A and A+1 or B and B+1 for storing data DA0 and DA1, or DB0 and DB1 are always paired. That is, in the DDR mode, a starting address for reading the data DA0 and DA1 is one of the addresses A and A+1, and a starting address reading the data DB0 and DB1 is one of the addresses B and B+1. In this embodiment, it is assumed that if the starting address is A in the DDR read/write operation then the data DA0 and DA1 are sequentially read/written, and that if the starting address A+1 then the data DA1 and DA0 are sequentially read/written.

Referring to FIG. 7, if input data bit DA0 (=DIN1) corresponding to an external address A for a SDR write operation is introduced into the device for the first cycle of clock signal K, path selection circuit 10 of FIG. 3 supplies input data bit DA0 to write register circuit 40 in response to path selection signals PSS. At this time, clock control circuit 30 receives clock signals K and KB, and generates write control clock signals WCLK and KDA1A for controlling register circuit 40 and 60. Input data bit DA0 is stored into one of registers 41, 43, 45, and 47 of register circuit 40 for the first cycle of clock signal K. And, during the first cycle of clock signal K, flag signal KDIN1 is applied to path selection circuit 50 and stored in one of registers 61, 63, 65, and 67 of register circuit 60, setting active a corresponding one out of flag signals W0F1–W0F4. For example, when DA0 corresponding to the SDR write address A is stored into the 1-stage pipelined data register 41 during the first cycle of the clock signal K, the flag signal KDIN1 is activated and also stored in the 1-stage pipelined flag register 61 during the first cycle of the clock K, and the other flag signals KDIN2–KDIN4 are set inactive. In the second cycle of the clock signal K, the data DA0 is stored in the 2-stage pipelined register 42 and the flag signal W0F1 is stored in the 2-stage pipelined register 42. Also, during the second cycle of the clock signal K, the write drive circuit 100 writes the data DA0 into a corresponding memory cell within the memory cell array 110 since the flag signal W0F1 is active.

In the second cycle of the clock signal K, a DDR write operation starts with an address B. Two input data bits DB0 and DB1, corresponding to the address B, are taken into the device for the second cycle of clock signal K. At this time, the input data DB0 is stored into one of the 1-stage pipelined data register 41, 43, 45 and 47 (e.g., into register 41 as data W0D1) depending upon the address B (i.e., starting address for the DDR operation) and one of the flag signals KDIN1–KDIN4 (e.g., KDIN1), corresponding to the register storing input data DB0, is active and stored into a corresponding one of the 1-stage pipelined flag registers 61, 63, 65 and 67 (e.g., into register 61 as flag signal W0F1).

During the third cycle of the clock signal K, the input data DB0 (i.e., W0D1) is stored in one of the 2-stage pipelined data register 42, 44, 46 and 48 (e.g., into register 42 as data W1D1) depending upon the burst address sequence and the flag signal (i.e., W0F1) is stored into a corresponding 2-stage pipelined flag register (e.g., into register 62 as flag signal W1F1). At this time, the next input data DB1 is stored into one of the 1-stage pipelined data register 41, 43, 45 and 47 (e.g., into register 41 as data W0D1) and one of the next flag signal (e.g., KDIN2), corresponding to the register storing input data DB1 (i.e., W0D1), is active and stored into a corresponding 1-stage pipelined flag register (e.g., into register 61 as flag signal W0F1).

During the third and fourth cycles of the clock signal K, successive DDR read operations start with addresses A+1 (which is one of a pair of addresses A and A+1 for the DDR operation) and B (which is one of a pair of addresses B and B+1 for the DDR operation). Since the two DDR read operations start just after the write operation of address B (i.e., the DDR write operation in the second cycle of clock signal K) without any intervening dummy cycle, it is impossible to write the input data bits DB0 and DB1 because of the write recovery for preventing a collision between the wirte data driven by write drive circuit 100 and the read data sensed by sense amplifier circuit 120.

Address comparator 70 compares read address signal RAi (i.e. A+1) with 1-stage pipelined write address signal W0Ai (i.e., B) and the 2-stage pipelined write address signal W1Ai (i.e., A) in the third cycle of the clock signal K. The address signal W0Ai (i.e., B) is delayed by one clock cycle of the clock signal K, and the address signal W1Ai (i.e., A) is delayed two clock cycles of the clock signal K, in order to distingush a normal read-out data bit QA1 read from a memory cell, corresponding to A+1, from bypass data bit QA0 of the input data DA0, corresponding to address A. If the read address RAi are indentical to the 1-stage pipelined write address W0Ai, BYPW0 and BYPE are generated in active states, or, if the read address RAi is identical to the 2-stage pipelined write address W1Ai, BYPW1 is activated together with BYPE.

In the fourth cycle of clock signal K, a read operation, corresponding to address B which is the same with that in the second cycle of clock signal K, is conductive. During this period, as data bits DB0 and DB1 corresponding address B have been all situated in a written state and flag signals W0F1 and W0F2 have been set into an activation state, data bits DB0 and DB1 are accessed under a bypass transmission and thereby driven into bypass data bits QB0 and QB1.

As described above, the data transmission circuitry of the present synchronous memory device, including the path selection circuits, the path selection control circuit, the register circuits, the switching circuits, the address comparator, and the output control circuit, can provide an extended and flexible data accessing function which is adaptable to various read/write operating protocols such as a normal read-out, a bypass read-out, a standard writing, and a late writing, even in a circumstance of the device employing its basic operating manner such as the SDR, the DDR, or the burst length. Thus, the device according to the invention does not need a dummy cycle for the write recovery even when a read cycle succeeds a wrie cycle.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A synchronous semiconductor memory comprising:

a memory cell array;

a clock control circuit for receiving at least one clock signal, and for generating at least one control signal, and at least one flag signal;

a first register circuit for storing a plurality of input data bits in response to the control signal;

a second register circuit for storing the flag signal in response to the control signal;

a write drive circuit for writing the input data bits stored in the first register circuit into the memory cell array in response to the flag signal during a write cycle;

an address comparator circuit for receiving read and write address signals and for generating at least one combination signal; and a switching circuit for outputting the input data bits stored in the first register circuit and the flag signal stored in the second register circuit in response to the combination signal.

2. The memory of claim 1, further comprising:

a path selection control circuit for generating at least one path selection control signal; and at least one path selection circuit associated with the first register circuit responsive to the path selection control signal for controlling passing of the input data bits through the first register circuit.

3. The memory of claim 2, further comprising a second path selection circuit associated with the second register circuit responsive to the path selection control circuit for controlling the flag signals that control the write drive circuit during a write cycle.

4. The memory of claim 2 wherein the path selection control circuit further generates a write enable signal, and the write drive circuit writes the input data bits in response to the write enable signal.

* * * * *